(12) United States Patent
Twu et al.

(10) Patent No.: US 6,417,106 B1
(45) Date of Patent: Jul. 9, 2002

(54) UNDERLAYER LINER FOR COPPER DAMASCENE IN LOW K DIELECTRIC

(75) Inventors: Jih-Churng Twu, Chung-Ho; Ying-Ho Chen, Taipei; Tsu Shih; Syun-Ming Jang, both of Hsin-Chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/431,150

(22) Filed: Nov. 1, 1999

(51) Int. Cl.[7] .............................................. H01L 21/302
(52) U.S. Cl. ...................... 438/687; 438/618; 438/624; 438/637; 438/704; 438/725; 438/740
(58) Field of Search ................................. 438/624, 618, 438/637, 638, 639, 640, 687, 692, 704, 725, 723, 724, 740, 743, 744

(56) References Cited

U.S. PATENT DOCUMENTS

| | | | |
|---|---|---|---|
| 5,818,110 A | 10/1998 | Cronin | 257/775 |
| 5,880,018 A | 3/1999 | Boeck et al. | 438/619 |
| 5,889,328 A | 3/1999 | Joshi et al. | 257/751 |
| 5,904,565 A | 5/1999 | Nguyen et al. | 438/687 |
| 6,054,379 A * | 4/2000 | Yau et al. | 438/623 |
| 6,124,200 A * | 9/2000 | Wang et al. | 438/624 |
| 6,184,128 B1 * | 2/2001 | Wang et al. | 438/637 |
| 6,225,204 B1 * | 5/2001 | Wu et al. | 438/597 |
| 6,331,481 B1 * | 12/2001 | Stamper et al. | 438/626 |
| 6,372,632 B1 * | 4/2002 | Yu et al. | 438/634 |

* cited by examiner

*Primary Examiner*—George Gouoreau
*Assistant Examiner*—George Goudreau
(74) *Attorney, Agent, or Firm*—George O. Saile; Stephen B. Ackerman

(57) ABSTRACT

A process for reducing dishing in damascene structures formed in low k organic dielectrics is described. A key feature is the insertion of a liner layer between the low k dielectric layer and the etch stop layer. The only requirement for the liner material is that it should have different etching characteristics from the etch stop material so that when trenches are etched in the dielectric they extend as far as the etch stop layer, in the normal way. When this is done it is found that dishing, after CMP, is significantly reduced, particularly for trench structures made up of multiple narrow trenches spaced close together.

19 Claims, 2 Drawing Sheets

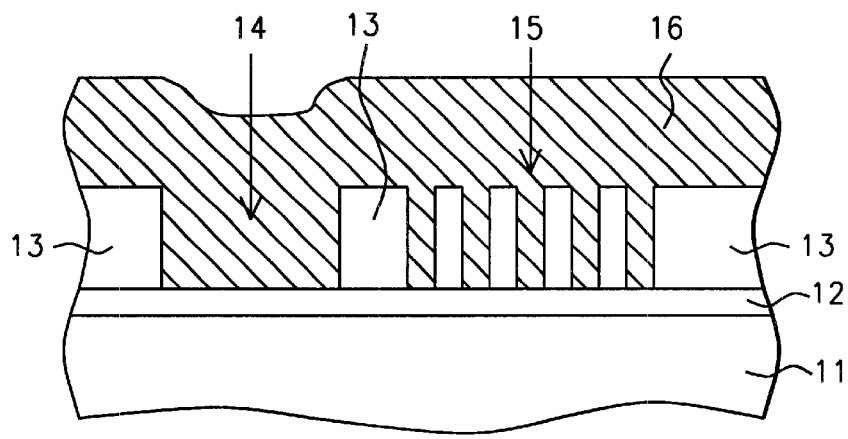
FIG. 1 - Prior Art
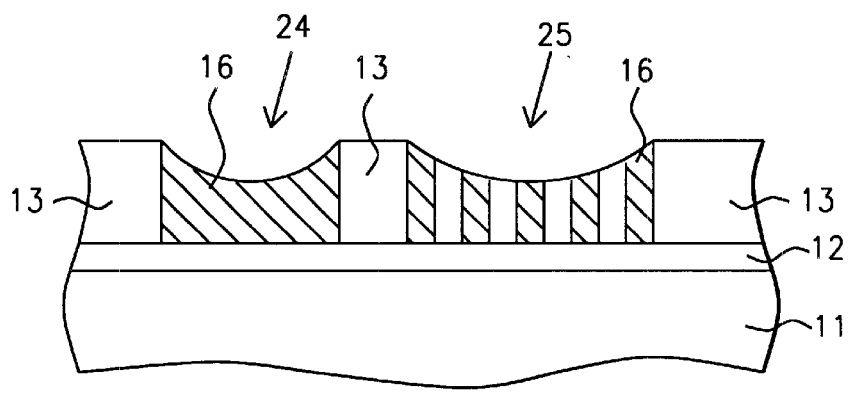
FIG. 2 - Prior Art
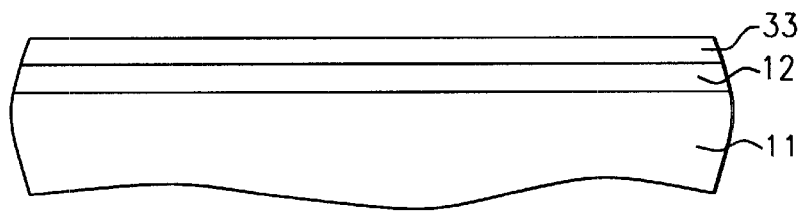
FIG. 3

UNDERLAYER LINER FOR COPPER DAMASCENE IN LOW K DIELECTRIC

FIELD OF THE INVENTION

The invention relates to the general field of integrated circuits with particular reference to damascene structures in low k dielectrics.

BACKGROUND OF THE INVENTION

The term damascene when used in connection with integrated circuit wiring, refers to the fact that a layer has been inlaid within a supporting medium, as opposed to being covered by it. The main advantage of this approach to wiring is that it is highly cost effective relative to conventional wiring. The word 'damascene' is derived from the city of Damascus where inlaid jewelry of this general format was first produced. Copper is the metal most widely used in damascene technology, because of its excellent electrical conductivity.

The basic process for forming a damascene structure is schematically illustrated in FIG. 1. Dielectric layer 13 has been laid down on substrate 11 which in most cases would itself be a dielectric layer that covers a partially completed integrated circuit. Wiring for said integrated circuit is to be formed within 13 which serves as a separator between different wiring levels, hence the term IMD or inter metal dielectric. An etch stop layer such as layer 12 is placed between layers 11 and 13 to facilitate formation of trenches, such as 14 and 15. These latter are then overfilled with copper (layer 16) giving the structure the appearance seen in FIG. 1.

Once the structure of FIG. 1 has been formed, all excess copper outside the trenches is removed as part of a planarizing step (usually, but not necessarily, chemical mechanical polishing or CMP) to level the topmost surface of the IC in anticipation of the formation of a new wiring layer. Unfortunately, because it is an intrinsically soft material, the copper gets removed somewhat faster than the surrounding dielectric material and the result is dishing of the copper across the mouths of trenches as illustrated in FIG. 2. Dishing is undesirable because it reduces the conductive cross-section of the wiring.

Various solutions have been proposed for minimizing the amount of dishing. For example, the planarization process may be terminated somewhat prematurely. Unfortunately this can result in a thin layer of copper being left behind on the surface of the dielectric. Other approaches have included placing a layer of a hard material immediately below and/or above the copper layer.

These various solutions to the dishing problem were developed for use with inorganic dielectric materials, such as silicon oxide. More recently, however, there has been a drive to replace these with dielectrics having lower dielectric constants, the so called low k dielectrics. For our purposes we will define a low k dielectric as one that has a dielectric constant less than about 3. Such materials are to be found in the realm of organic rather than inorganic compounds. Examples include hydrogen silsesquioxane, fluorinated polyimide, polyarylene ether, fluorinated arylene ether, polytetrafluoro-ethylene, and benzocyclobutene. Materials of this type are not, in general, as mechanically rigid as their inorganic counterparts so that the edges of the trenches tend to yield more to the stress of CMP thereby exacerbating the dishing problem. This additional contribution to the dishing effect is particularly noticeable in the case of many narrow trenches side by side (such as 15 in FIG. 1) as compared to isolated, wide trenches (such as 14).

The present invention teaches a way to reduce dishing in low k (soft) dielectrics during CMP, particularly for multiple narrow trenches close together. In a search of the prior art we were unable to find any references that teach the method of the present invention. Some references were, however, found to be of interest. For example, in a non-damascene process, Boeck et al. (U.S. Pat. No. 5,880,018) initially use a high k dielectric and then replace portions of it with a low k dielectric in places where this is needed, such as at crossover points between wires.

Joshi et al. (U.S. Pat. No. 5,889,328) avoids the problem of dishing by using a damascene-like process that requires no planarization steps since the starting point is a planar surface and removal of excess material is performed by chemical etching. Cronin (U.S. Pat. No. 5,818,110) describes a damascene process that uses two etch stop layers but these are separated from one another by the dielectric layer. Nguyen et al. (U.S. Pat. No. 5,904,565) teach a method for making contact through the via hole in a dual damascene process. A key feature is the anisotropic etching of the barrier layer whereby it is preferentially removed between the two levels that need to make contact.

SUMMARY OF THE INVENTION

It has been an object of the present invention to provide a process for the formation of a damascene structure.

Another object on the invention has been that said process result in a minimum of dishing at the surface of the structure.

A still further object has been that said damascene structure be formed in a dielectric layer of low dielectric constant.

These objects have been achieved by interposing a liner layer between the low k dielectric layer and the etch stop layer. The only requirement for the liner material is that it should have different etching characteristics from the etch stop material so that when trenches are etched in the dielectric they extend as far as the etch stop layer, in the normal way. When this is done it is found that dishing, after CMP, is significantly reduced particularly for trench structures made up of multiple narrow trenches spaced close together.

BRIEF DESCRIPTION OF THE DRAWINGS

FIG. 1 illustrates the early stages in the formation of a damascene type structure.

FIG. 2 shows a completed damascene structure in which significant dishing of the filled trenches has occurred after CMP.

FIG. 3 shows the starting point for the process of the present invention.

DESCRIPTION OF THE PREFERRED EMBODIMENTS

While the invention will be described in terms of forming wiring in an integrated circuit, it is capable of more widespread application, in particularly when any soft layer of a material is to be worked so as to include in it a damascene structure whose formation involves chemical mechanical polishing of an over-filled trench.

We refer now to FIG. 3. Starting with a substrate 11, which would most likely be a dielectric layer (having an uneven surface) serving as the topmost layer of a partially completed integrated circuit, etch stop layer 12 (which could be silicon oxide, silicon oxynitride, or silicon nitride) is deposited to a thickness between about 50 and 500 Angstroms.

Then, in a departure from the prior art, liner layer 33 is deposited. The principal characteristic of layer 33 is that it must have different etching properties from etch stop layer 12. In particular, it should not act as an etch stop layer for the dielectric. Examples of materials from which the liner layer could be formed include PE (plasma enhanced) silicon oxide, silicon rich silicon oxynitride, PE TEOS (tetraethyl orthosilicate), silicon oxynitride, and silicon nitride. The liner layer is deposited to a thickness between about 50 and 500 Angstroms.

Figure 4:
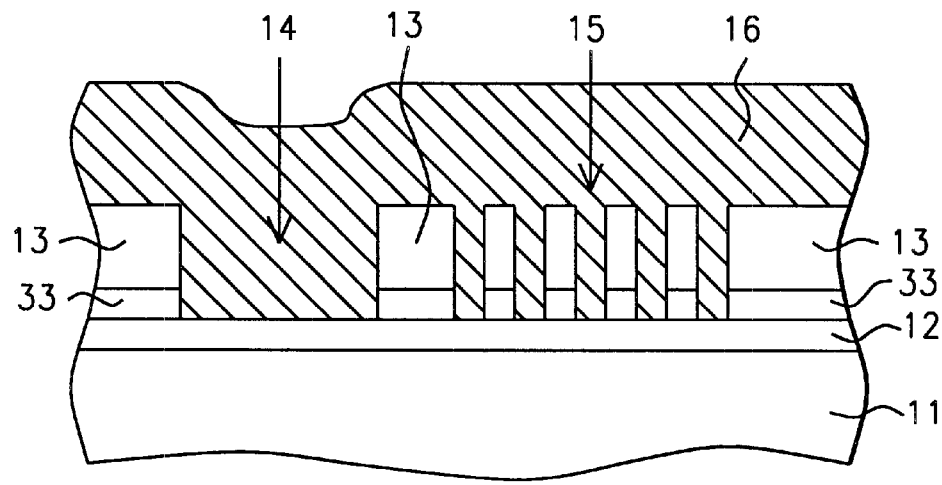
FIG. 4 shows an intermediate stage of the process.

Referring now to FIG. 4, the next step is deposition of low k dielectric layer 13 over liner layer 33. Our preferred method for depositing the low k dielectric layer has been spin coating but other methods could also have been used. Examples of materials that could be used for the low k dielectric layer include FLARE (fluorinated arylene ether), SILK (Dow Chemical proprietary aromatic polymer), HSQ, GSQ, and nonoglass. Low k dielectric layer 13 is deposited to a thickness between about 1,000 and 10,000 Angstroms. A layer of photoresist (not shown) is laid down on the top surface of 13 and patterned to form a mask that defines the desired trench structure. After etching the dielectric and liner layers down to the level of etch stop layer 12, trenches such as 14 and 15 are formed. Typically, these trenches would occupy about 50% of the total area in which they are present. The trenches would be etched to a depth between about 1,000 and 10,000 microns. Once completed, the trenches are then overfilled with copper layer 16, giving the structure the appearance shown in FIG. 4.

Figure 5:
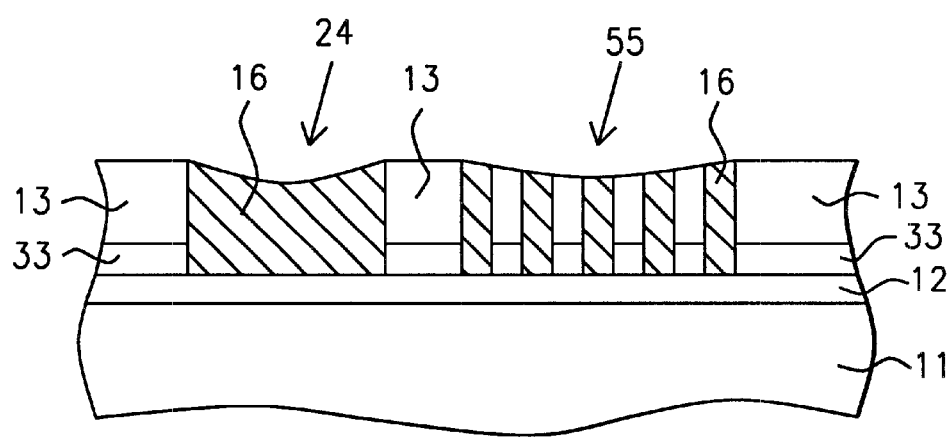
FIG. 5 shows a damascene structure formed according to the teachings are the present inventions, illustrating that dishing has been reduced.

The step following this is a planarizing step, using CMP, so that the copper just fills the trench structure leading to the damascene structure illustrated in FIG. 5.

We have found that the addition of the liner layer brings about a significant reduction in the amount of dishing that takes place as a result of CMP, particularly for trench structures made up of multiple narrow trenches spaced close together. This is illustrated by trench structure 55 in FIG. 5 which may be compared with the dishing seen in a similar trench structure of the prior art (35 in FIG. 2).

Some actual data, showing the effectiveness of the invention are summarized in TABLE I below:

TABLE I

| Trench geometry | Erosion due to dishing. | |
|---|---|---|
| | PRIOR ART | INVENTION |
| Single large trench[1] | 1,000–1,500 Å | 1,000–1,500 Å |
| Multiple narrow trenches[2] | 600–1,000 Å | 200–500 Å |

[1]120 × 120 microns
[2]occupying about 50% of the area

While the invention has been particularly shown and described with reference to the preferred embodiments thereof, it will be understood by those skilled in the art that various changes in form and details may be made without departing from the spirit and scope of the invention.

What is claimed is:

1. A process for working a layer of a soft material, comprising:
   providing a substrate and depositing thereon an etch stop layer;
   on said etch stop layer, depositing a liner layer of a material having different chemical mechanical etching characteristics from said etch stop layer;
   depositing a layer of a soft material on the liner layer; and then forming a damascene structure in said soft layer.

2. The process of claim 1 wherein the etch stop layer is selected from the group consisting of PE silicon oxide, silicon rich silicon oxynitride, PETEOS, silicon oxynitride, and silicon nitride.

3. The process of claim 1 wherein the etch stop layer is deposited to a thickness between about 50 and 500 Angstroms.

4. The process of claim 1 wherein said liner layer is selected from the group consisting of PE silicon oxide, silicon rich silicon oxynitride, PETEOS, silicon oxynitride, and silicon nitride.

5. The process of claim 1 wherein the liner layer is deposited to a thickness between about 50 and 500 Angstroms.

6. The process of claim 1 wherein said soft layer is selected from the group consisting of FLARE, SILK, nonoglass, fluorinated silicate glass, and HSQ.

7. The process of claim 1 wherein the soft layer is deposited to a thickness between about 1,000 and 10,000 Angstroms.

8. The process of claim 1 wherein the soft layer is deposited by means of spin coating.

9. A process for planarizing a partially completed integrated circuit, comprising:
   depositing an etch stop layer on said integrated circuit;
   on said etch stop layer, depositing a liner layer of a material having different etching characteristics from said etch stop layer;
   depositing a layer of a low k dielectric material on the liner layer; depositing a layer of photoresist on the low k dielectric layer and forming therefrom a mask that defines a trench structure;
   etching the dielectric and the liner layers down to the etch stop layer, thereby forming a trench structure that further comprises a plurality of trenches within an area, said trenches occupying about half of said area;
   removing the photoresist;

overfilling the trench structure with copper; and then planarizing said dielectric layer whereby the copper just fills the trench structure and a damascene structure is formed with dishing across said area being less than about 500 Angstroms.

10. The process of claim 9 wherein the step of planarizing the dielectric layer further comprises use of chemical mechanical polishing.

11. The process of claim 9 wherein the trench structure further comprises an area of which 50% is occupied by trenches separated one from another by between about 0.2 and 1 microns.

12. The process of claim 9 wherein the trench structure is etched to a depth between about 1,000 and 10,000 microns.

13. The process of claim 9 wherein the etch stop layer is selected from the group consisting of PE silicon oxide, silicon rich silicon oxynitride, PETEOS, silicon oxynitride, and silicon nitride.

14. The process of claim 9 wherein the etch stop layer is deposited to a thickness between about 50 and 500 Angstroms.

15. The process of claim 9 wherein said liner layer is selected from the group consisting of PE silicon oxide, silicon rich silicon oxynitride, PETEOS, silicon oxynitride, and silicon nitride.

16. The process of claim 9 wherein the liner layer is deposited to a thickness between about 50 and 500 Angstroms.

17. The process of claim 9 wherein said low k dielectric layer is selected from the group consisting of FLARE, SILK, nonoglass, fluorinated silicate glass, and HSQ.

18. The process of claim 9 wherein the low k dielectric layer is deposited to a thickness between about 1,000 and 10,000 Angstroms.

19. The process of claim 9 wherein the low k dielectric layer is deposited by means of spin coating.

* * * * *